(12) United States Patent
Spiegelman et al.

(10) Patent No.: US 12,035,492 B2
(45) Date of Patent: Jul. 9, 2024

(54) PRELOADED FLEXIBLE LATCH ASSEMBLY

(71) Applicant: International Business Machines Corporation, Armonk, NY (US)

(72) Inventors: Adam Spiegelman, The Hills, TX (US); Kevin O'Connell, Rochester, MN (US); Kenneth E. Lubahn, Oronoco, MN (US); Justin Christopher Rogers, Rochester, MN (US); Eric J. Campbell, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 92 days.

(21) Appl. No.: 17/489,863

(22) Filed: Sep. 30, 2021

(65) Prior Publication Data

US 2023/0041984 A1     Feb. 9, 2023

Related U.S. Application Data

(60) Provisional application No. 63/230,671, filed on Aug. 6, 2021.

(51) Int. Cl.
*H05K 5/02* (2006.01)
*E05C 3/14* (2006.01)
*E05C 5/02* (2006.01)
*E05C 19/06* (2006.01)

(52) U.S. Cl.
CPC ............. *H05K 5/0221* (2013.01); *E05C 3/14* (2013.01); *E05C 5/02* (2013.01); *E05C 19/06* (2013.01)

(58) Field of Classification Search
CPC ....................................................... H05K 5/00
See application file for complete search history.

(56) References Cited

U.S. PATENT DOCUMENTS

| | | | |
|---|---|---|---|
| 4,085,960 A | 4/1978 | Sherman | |
| 4,931,907 A | 6/1990 | Robinson | |
| 5,207,479 A | 5/1993 | Wickman | |
| 5,267,761 A | 12/1993 | Curtindale | |
| 6,058,579 A | 5/2000 | Brocklesby | |
| 6,070,921 A | 6/2000 | Valasin | |
| 8,936,477 B1 * | 1/2015 | Kerrigan | H01R 43/26 439/157 |
| 8,953,332 B2 | 2/2015 | Canfield | |

(Continued)

FOREIGN PATENT DOCUMENTS

| | | |
|---|---|---|
| CN | 213240998 U | 5/2021 |
| WO | 9966772 A1 | 12/1999 |

OTHER PUBLICATIONS

International Search Report and Written Opinion for Application PCT/IB2022/057150, Nov. 22, 2022, 10 pages.

(Continued)

*Primary Examiner* — Jerry Wu

(74) *Attorney, Agent, or Firm* — Yee & Associates, P.C.

(57) ABSTRACT

A latch mechanism includes a mounting bracket, a stop connected to the mounting bracket, a first spring connected to the mounting bracket and in contact with the stop to preload the first spring, and a latch. The latch includes a second spring rotatably connected to the mounting bracket, and a body connected to the second spring. The body includes a pad at one end of the body, and a first pawl at a second end of the body opposite of the pad.

14 Claims, 11 Drawing Sheets

(56) References Cited

U.S. PATENT DOCUMENTS

| | | |
|---|---|---|
| 9,485,879 B2 | 11/2016 | Molnar |
| 9,617,766 B2 | 4/2017 | Eckberg |
| 9,896,867 B2 | 2/2018 | Eckberg |
| 10,053,894 B2 | 8/2018 | Eckberg |
| 2003/0039100 A1 | 2/2003 | Salinas |
| 2004/0218370 A1 | 11/2004 | Wong |
| 2010/0132522 A1* | 6/2010 | Peterson ................ B26D 7/015 |
| | | 83/485 |
| 2014/0044480 A1 | 2/2014 | Crippen |
| 2015/0076839 A1 | 3/2015 | Eckberg |
| 2019/0383071 A1 | 12/2019 | Elsasser |
| 2020/0189775 A1* | 6/2020 | Berkey ................ B65B 13/265 |

OTHER PUBLICATIONS

Search Report and Written Opinion dated Mar. 1, 2024, for GB Application No. GB2400808.8, filed Aug. 2, 2022.

\* cited by examiner

PRELOADED FLEXIBLE LATCH ASSEMBLY

BACKGROUND

The present disclosure relates to component latches, and more specifically, to component latches for electronic components having electrical signal connectors.

In general, component latches may serve a number of purposes at least including locating a component properly within a bay, holding a component within a component bay, and docking electrical signal connectors of the component to the component bay. As the complexity of components increases, and the cost of replacement component increases, the desire to properly latch those components similarly increases.

Toward this end, many components have strict requirements to ensure that these components can satisfy an expected performance. This includes requirements for interconnect pieces that connect various discrete modules, such as pins that are particularly short that interact with component connectors. Where computer devices end up with situations where it is not feasible for whatever reason to build these interconnect pieces with tight tolerances, the interaction between pins and component connectors may be inclined to fail as a result of a these low-tolerance short pins. For example, many component latches may actuate in such a way that they start by imparting zero force, and then, when actuated, quickly ramp up to their peak force. However, this may impart an amount of force that is structurally damaging (or otherwise suboptimal) for these low-tolerance short pins.

SUMMARY

According to an embodiment of the present disclosure, a latch mechanism includes a mounting bracket, a stop connected to the mounting bracket, a first spring connected to the mounting bracket and in contact with the stop to preload the first spring, and a latch. The latch includes a second spring rotatably connected to the mounting bracket, and a body connected to the second spring. The body includes a pad at one end of the body, and a first pawl at a second end of the body opposite of the pad.

According to an embodiment of the present disclosure, a computer system component bay includes a frame including a lug and an input connector, and a cassette configured to be inserted into the frame. The cassette includes a housing, an output connector connected to the electronic component and configured to connect with the input connector, and a latch mechanism. The latch mechanism includes a first spring connected to the housing and a latch configured to engage the first spring and the lug when the latch mechanism is in the closed configuration, wherein the latch comprises a second spring rotatably connected to the housing.

According to an embodiment of the present disclosure, a latch mechanism includes a mounting bracket, a stop connected to the mounting bracket, and a latch rotatably connected to the mounting bracket. The latch includes a body including a pad at a first end of the body and a pawl at a second end of the body opposite of the pad, a first spring connected to the body and in contact with the stop to preload the first spring, and a second spring connected to the body.

According to an embodiment of the present disclosure, a computer system component bay includes a frame including a lug and an input connector, and a cassette configured to be inserted into the frame. The cassette includes a housing, an output connector connected to the electronic component and configured to connect with the input connector, and a latch mechanism. The latch mechanism includes a stop connected to the housing and a latch. The latch includes a body, a first spring connected to the body, and a second spring connected to the body, wherein the second spring is rotatably connected to the housing at a location opposite to the body.

According to an embodiment of the present disclosure, a method of operating a computer system component bay includes placing a cassette into a frame, engaging an output connector of the cassette with an input connector of the frame, engaging a lug on the frame with a latch of a latching mechanism of the cassette, rotating the latch to force the cassette farther into the frame and to engage a first spring of the cassette with the latch, and rotating the latch further to elastically deform the first spring and a second spring of the latch to move the latching mechanism into a closed configuration.

DETAILED DESCRIPTION

Figure 1A:
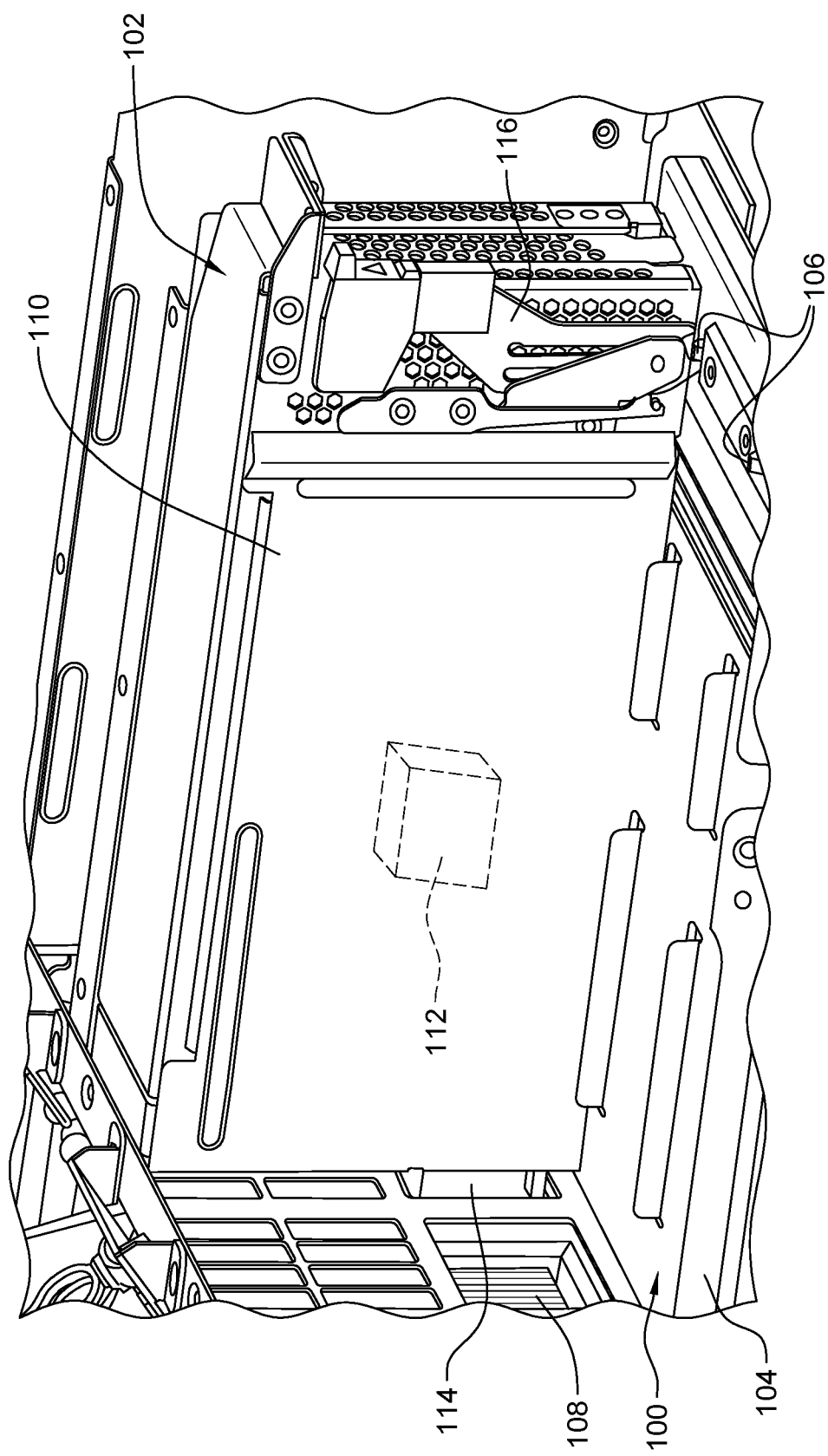
FIG. 1A is a perspective view of a computer system component bay (CSCB) with a peripheral component interconnect (PCI) cassette installed therein, in accordance with an embodiment of the present disclosure.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. In addition, any numerical ranges included herein are inclusive of their boundaries unless explicitly stated otherwise.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary components at the interface of the two elements.

Figure 1B:
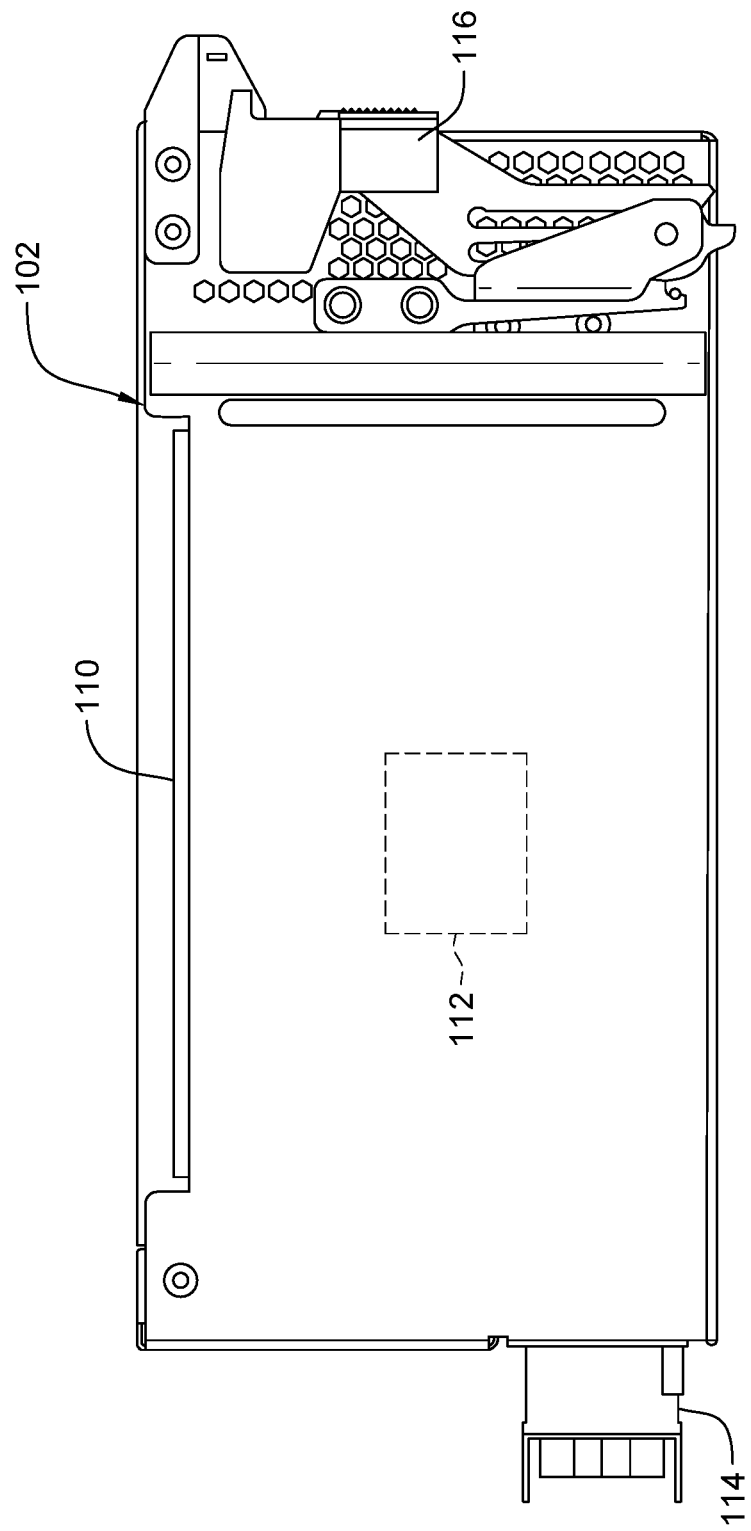
FIG. 1B is a side view of the PCI cassette with a latch mechanism, in accordance with an embodiment of the present disclosure.

FIG. 1A is a perspective view of computer system component bay (CSCB) 100 with peripheral component interconnect (PCI) cassette 102 installed therein. FIG. 1B is a side view of PCI cassette 102. FIGS. 1A and 1B will now be discussed in conjunction with one another. In the illustrated embodiment, CSCB 100 includes frame 104, lugs 106, and input connectors 108 (although only one input connector 108 is visible in FIG. 1A). A frame 104 is a structure which is configured to receive a plurality of computing components such as PCI cassettes 102, where receiving these computing components includes mechanically receiving them and facilitating the communicative coupling of these computing components. Input connectors 108 are rigid electro-mechanical structures that are configured to physically mate with corresponding components of PCI cassettes 102 (i.e., output connector 114) to therein electrically couple respective PCI cassettes 102 to other components secured to the frame 104. Input connectors 108 are connected to frame 104 and so are lugs 106. Each lug 106 is a rigid protrusion that is configured to engage with a PCI cassette 102.

In the illustrated embodiment, PCI cassette 102 includes housing 110, electronic component 112, output connector 114, and latch mechanism 116. Housing 110 is a mechanical structure that defines much of an external surface of PCI cassette 102 and receives and/or securely stores most of PCI cassette 102 (e.g., electronic component 112). Electronic component 112 is a computing device such as, for example, a central processing unit (CPU), random-access memory (RAM), non-volatile memory, graphics card, input/output interface, and/or network interface. Latch mechanism 116 is a moving assembly (that moves relative to itself and also relative to the housing 110) that is configured to facilitate the insertion and removal of PCI cassette 102 from frame 104. Output connector 114 is communicatively connected to electronic component 112 and is structurally connected to housing 110. Latch mechanism 116 is also securely connected to a terminal end of housing 110. Output connector 114 is configured to engage with an input connector 108, and latch mechanism 116 is configured to engage with a lug 106. Thereby, PCI cassette 102 can be inserted into CSCB 100 and secured by latch mechanism 116. Furthermore, electronic component 112 can be communicatively connected to CSCB 100.

Figure 2A:
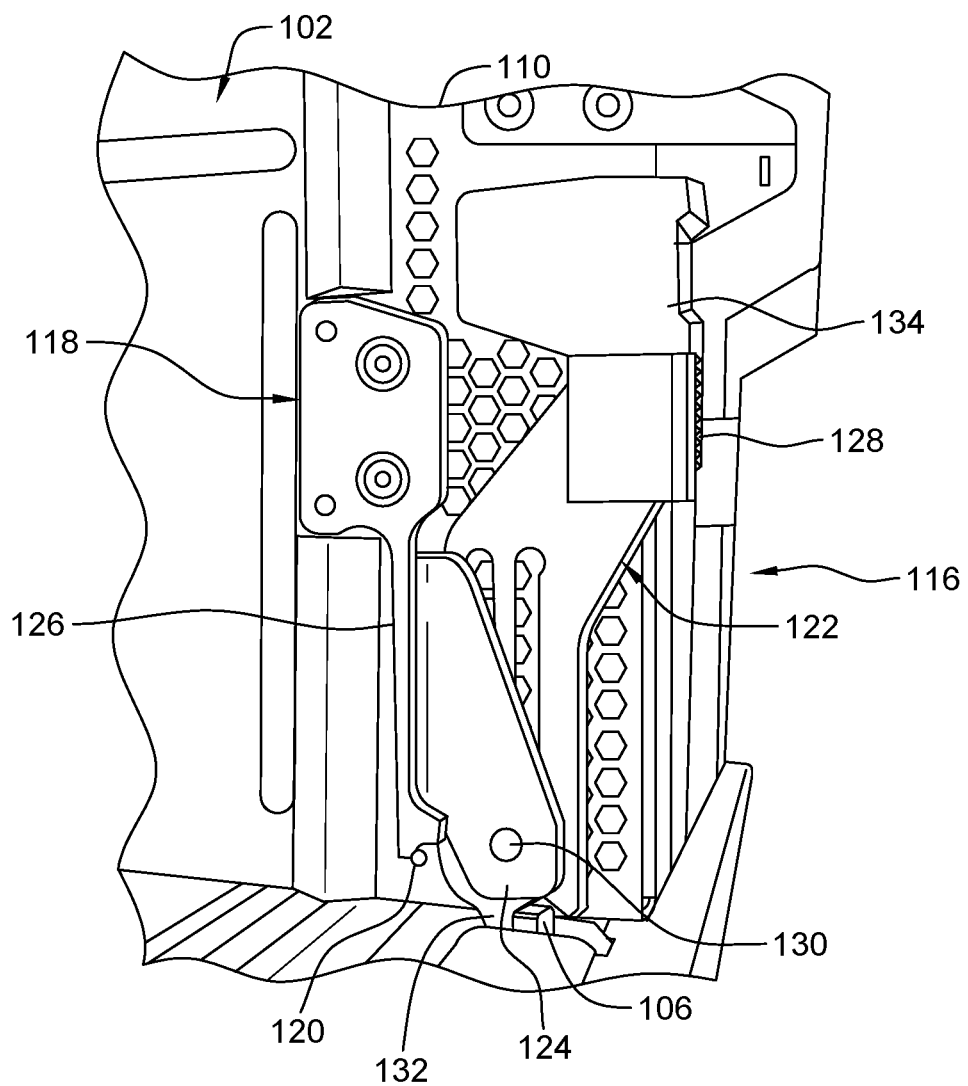
FIG. 2A is a side view of the latch mechanism of the PCI cassette in a closed configuration, in accordance with an embodiment of the present disclosure.
Figure 2B:
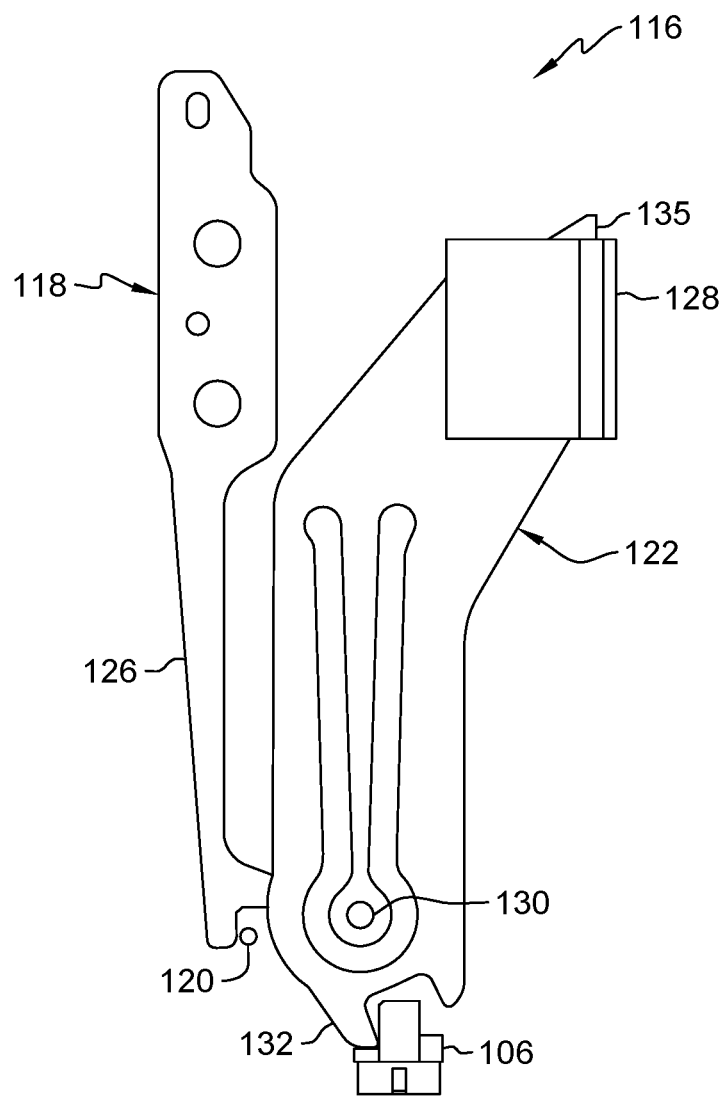
FIG. 2B is a side view of the latch mechanism of the PCI cassette in the closed configuration with a brace removed, in accordance with an embodiment of the present disclosure.
Figure 2C:
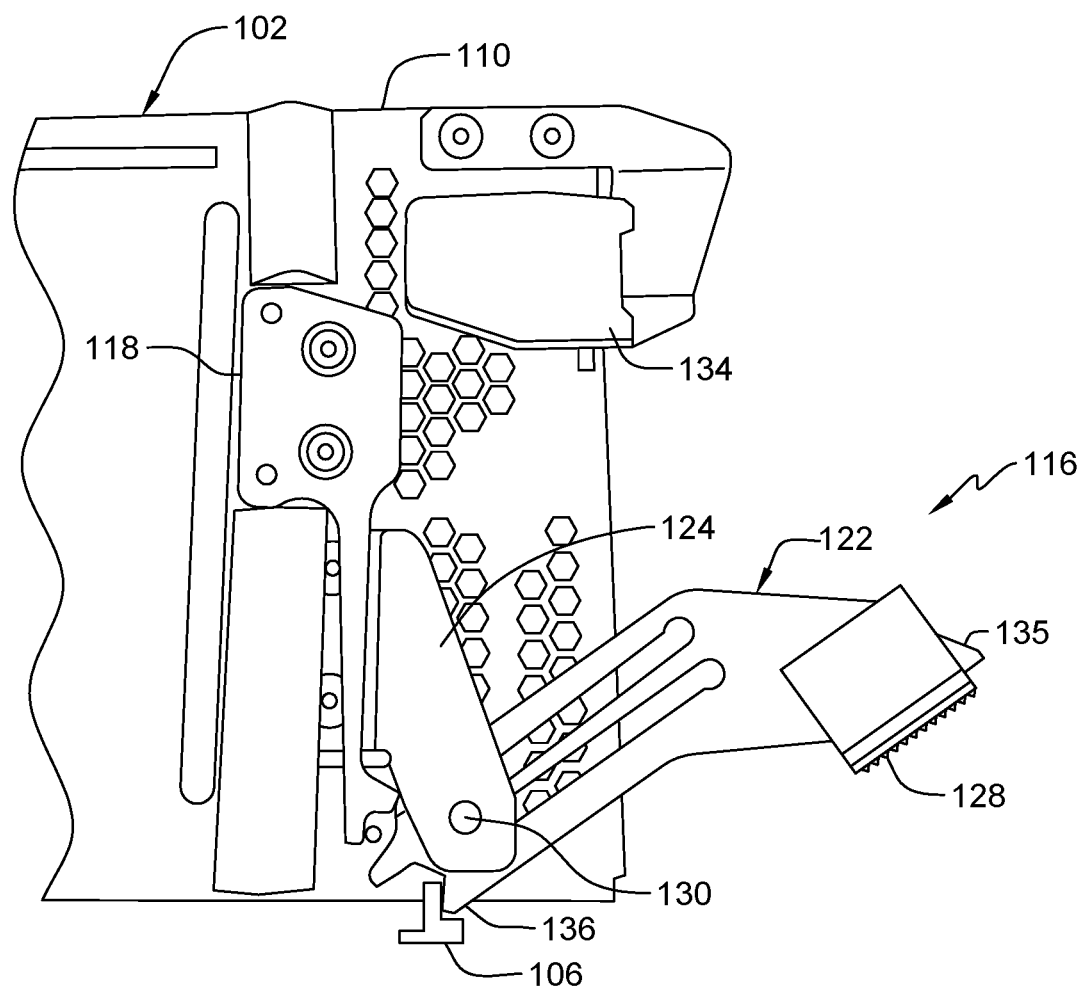
FIG. 2C is a side view of the latch mechanism of the PCI cassette in an opened configuration, in accordance with an embodiment of the present disclosure.

FIG. 2A is a side view of latch mechanism 116 of PCI cassette 102 in a closed configuration, which is a first predetermined arrangement of components of latch mechanism 116 defined by these components moving relative to themselves. FIG. 2B is another side view of latch mechanism 116 of PCI cassette 102 in the closed configuration. FIG. 2C is a side view of latch mechanism 116 of PCI cassette 102 in an opened configuration, which is a second predetermined arrangement of components of latch mechanism 116 defined by these same components moving relative to themselves in a different manner. In some examples, the closed configuration and the open configuration are the two "extreme" positions that latch mechanism 116 can define, such that all positions that latch mechanism 116 can define (e.g., define relative to housing 116) are between these two positions. FIGS. 2A-2C will now be discussed in conjunction with one another.

In the illustrated embodiment, housing 110 serves as a mounting bracket for the components of latch mechanism 116. Latch mechanism 116 includes primary spring 118 (a flat lever that is configured to flex as the latch mechanism 116 is opened and closed), stop 120 (a rigid component configured to remain stationary relative to housing 110 to act as a physical stop for primary spring 118), latch 122 (a component configured to pivot away from primary spring 118 to facilitate movement and securing of PCI cassette 102), and brace 124 (a component configured to restrain latch 122 alongside housing 110, although brace 124 has been removed from FIG. 2B for clarity). Primary spring 118 is rigidly connected to housing 110 at the top end and includes a cantilevered arm 126 (a primary longitudinal component of primary spring 118 that is thinner than the portion of primary spring 118 that is rigidly connected to housing 110) extending downward. Arm 126 is prevented from moving (rightward) to a neutral state by stop 120, which is a pin extending from housing 110. Thereby, arm 126 is biased towards stop 120, and when arm 126 is initially contacted by latch 122, arm 126 exerts a preloaded amount of force on latch 122. As latch 122 is closed, arm 126 is forced off of stop 120 and offers greater resistance to latch 122.

The purpose of latch mechanism 116 moving to the closed configuration is to insert PCI cassette 102 into CSCB 100 (shown in FIG. 1A). This is accomplished by a user (not shown) pressing on finger pad 128, which is a component secured to a terminal end of latch 122 (i.e., the end distal from pin 130 and at the opposite end from pawl 132) that is configured to be pressed to actuate latch mechanism 116 (e.g., where finger pad 128 provides a surface that is flat, non-sharp, soft, visually identifiable, or the like for a user (not shown) to press with a finger or the like). Because latch 122 is rotatably connected to housing 110 by pin 130, latch 122 rotates about pin 130 (a rigid component that defines rotation of latch 122 and is securely and/or permanently affixed to housing 110) which causes pawl 132 to engage lug 106. Latch 122 can be captured by lock 134 (e.g., at nub 135, which is a protrusion on the distal end of latch 122), which maintains latch mechanism 116 in the closed configuration.

Similarly, latching mechanism 116 can move to the opened configuration to extract PCI cassette 102 from CSCB 100. This is accomplished by a user disengaging lock 134 (e.g., by moving lock 134 upwards) and rotating finger pad 128 away from primary spring 118. This causes latch 122 to rotate about pin 130 which causes pawl 136 to engage the opposite side of lug 106.

Figure 3A:
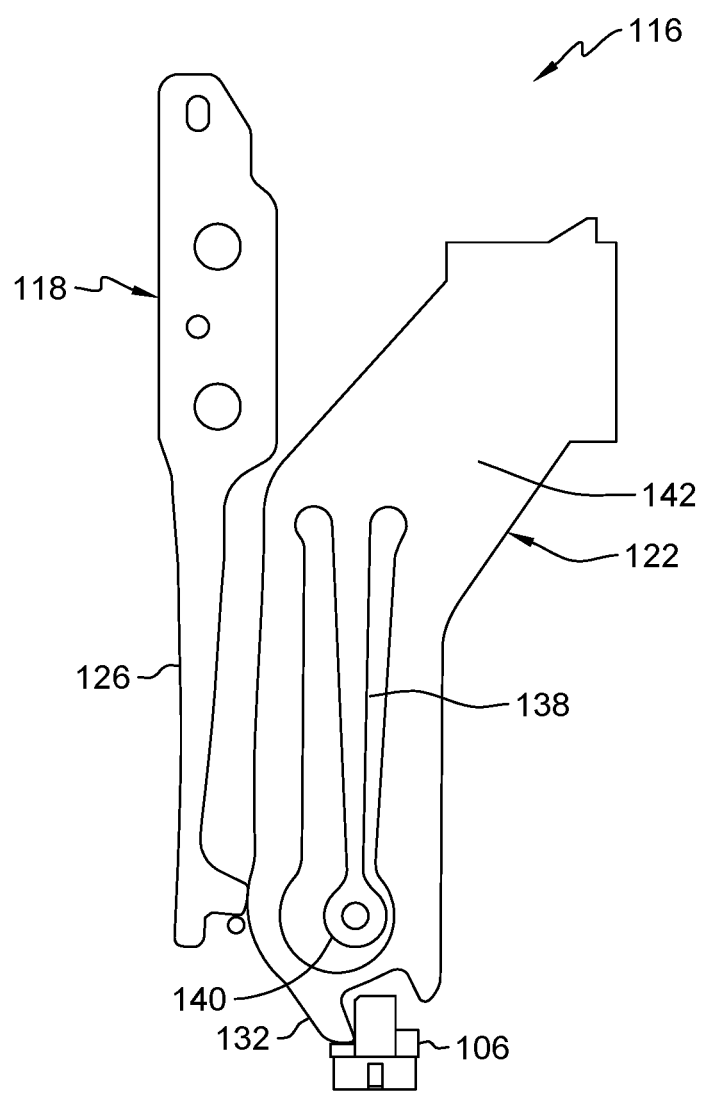
FIG. 3A is a side view of the latch mechanism of the PCI cassette in the closed configuration showing elastic deformation of a primary spring and a secondary spring, in accordance with an embodiment of the present disclosure.

FIG. 3A is a side view of latch mechanism 116 in the closed configuration showing elastic deformation (exaggerated for clarity) of primary spring 118 and secondary spring 138, which are both comprised of a metallic material, such as a hardened and tempered 1095 spring steel with a thickness of 1.2 millimeters (mm). Latch 122 itself includes secondary spring 138 between mounting portion 140 and the main body 142 of latch 122. When latch mechanism is in the closed configuration, secondary spring 138 also elastically deforms. Thereby, both primary spring 118 and secondary spring 138 exert force on PCI cassette 102 towards CSCB 100, which ensures that the connection between input connector 108 and output connector 114 (both shown in FIG. 1A) is maintained. In addition, any twisting movement of latch 122 under load is prevented by being sandwiched between housing 110 and brace 124.

Figure 3B:
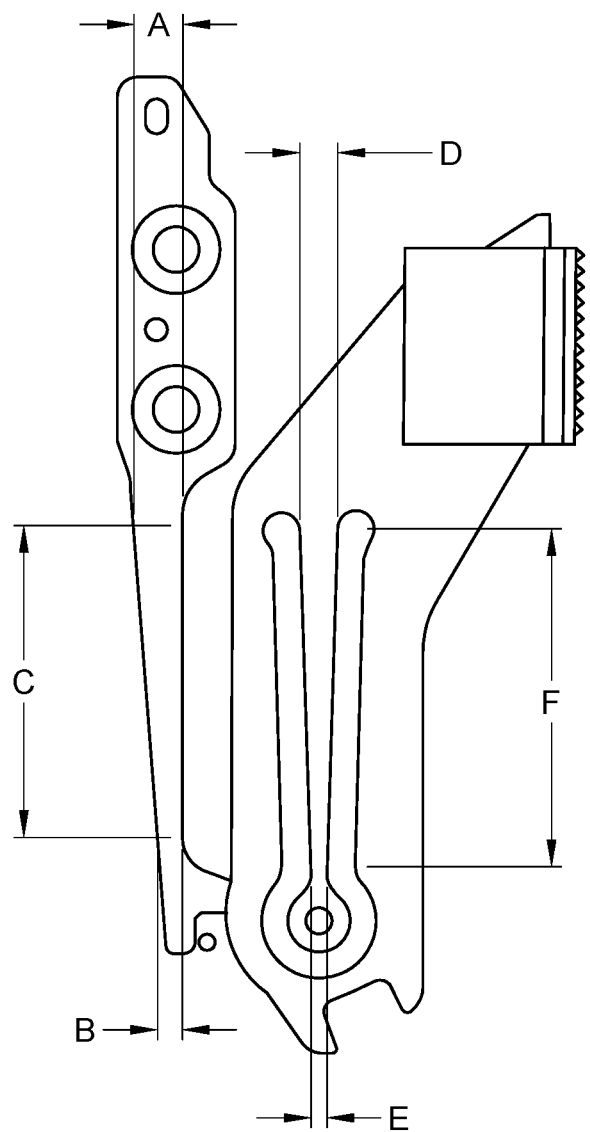
FIG. 3B is a side view of the latch mechanism of the PCI cassette showing some dimensional indicators, in accordance with an embodiment of the present disclosure.

FIG. 3B is a side view of latch mechanism 116 showing some dimensional indicators. Dimensions A-F have been included on latch mechanism 116 in FIG. 2D for an exemplary, non-limiting description of some embodiments of the present disclosure. In the illustrated embodiment, the supported end of primary spring 118 (i.e., dimension A) is about 3.8 mm wide, the free end of primary spring 118 (i.e., dimension B) is about 1.9 mm wide, and the length between dimension A and dimension B (i.e., dimension C) is about 24 mm. In addition, the supported end of secondary spring 138 (i.e., dimension D) is about 2.9 mm wide, the free end of secondary spring 138 (i.e., dimension E) is about 1.3 mm wide, and the length between dimension D and dimension E (i.e., dimension F) is about 25 mm. Thereby, primary spring 118 is a substantially stiffer spring than secondary spring 138.

Figure 4:
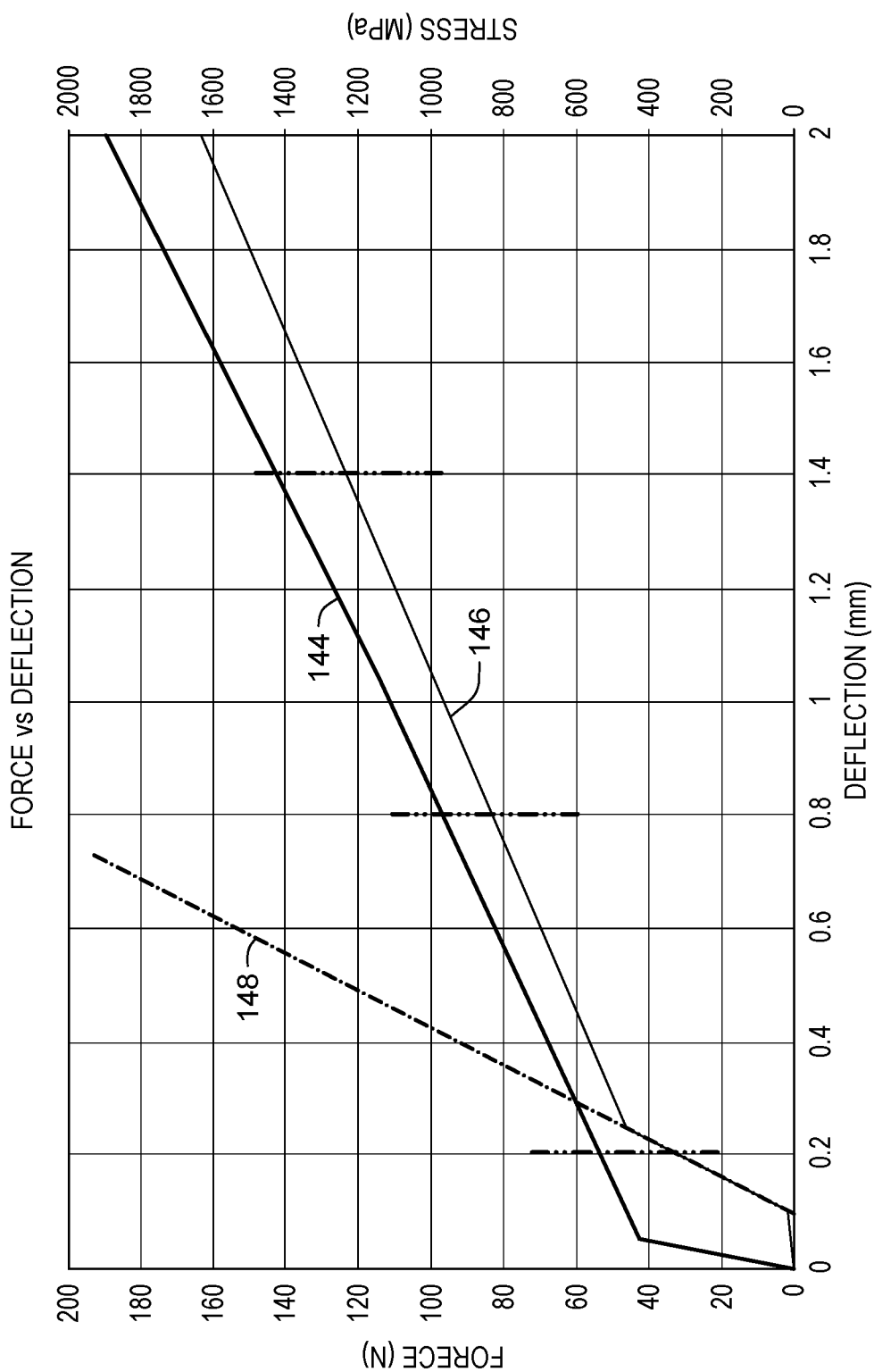
FIG. 4 is a graph of force versus deflection for the latch mechanism of FIG. 2A and for an alternative latch mechanism of FIG. 5A, in accordance with an embodiment of the present disclosure.
Figure 5A:
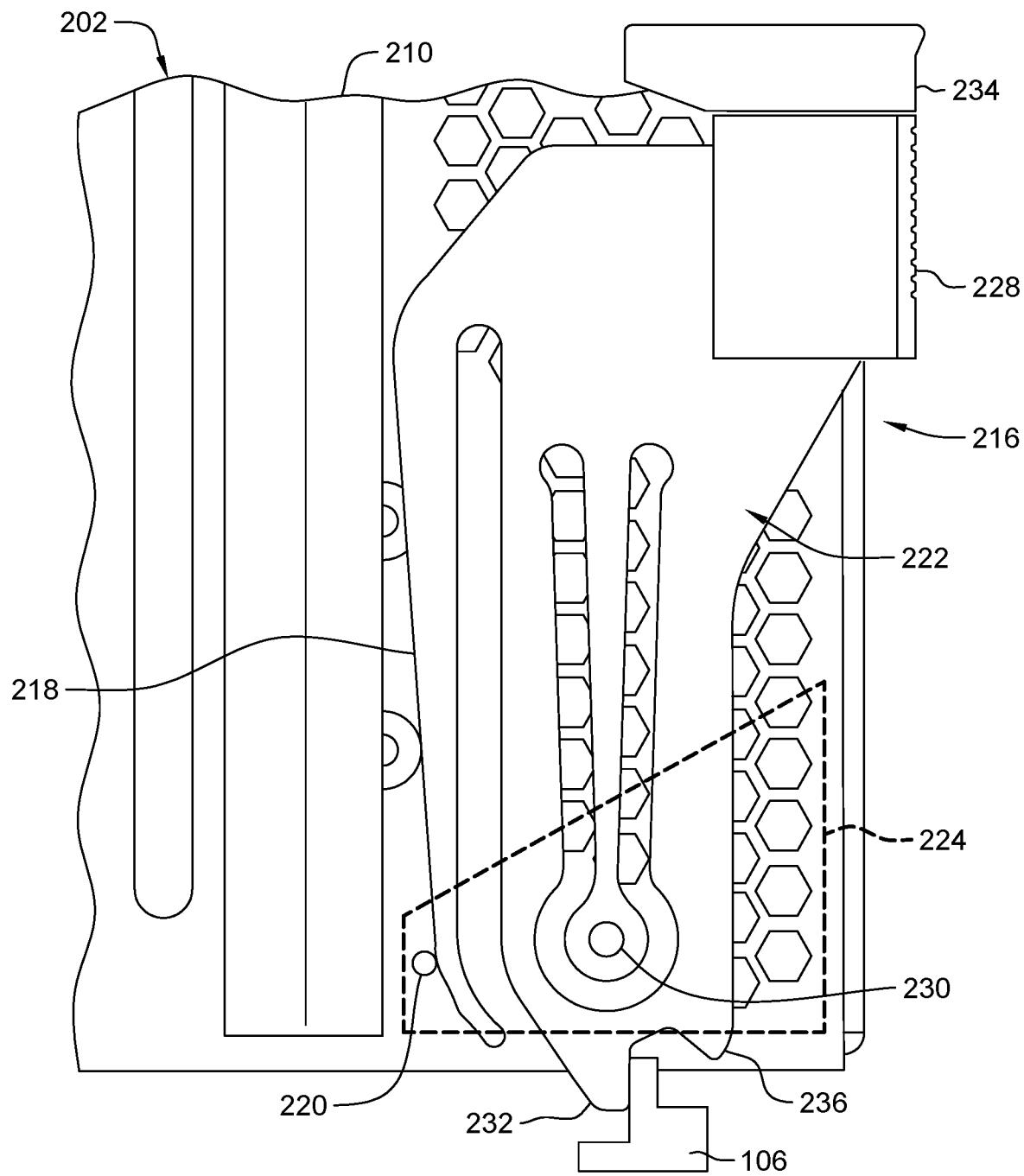
FIG. 5A is a side view of the alternative latch mechanism of the PCI cassette in a closed configuration, in accordance with an embodiment of the present disclosure.

FIG. 4 is a graph of force versus deflection curve 144 for latch mechanism 116 of FIG. 2A and force versus deflection curve 146 for alternative latch mechanism 216 of FIG. 5A. In the illustrated embodiment, the force from latch mechanism 116 is nominally about 96 Newtons (N). This can occur when all the components are nominally sized and positioned, which results in a nominal deflection of 0.8 mm. However, there can be deviations from the nominal configuration, for example, due to tolerance stacking. This can cause, for example, pawl 132 to engage lug 106 (both shown in FIG. 2A) sooner or later. In an example of the former case, latch mechanism 116 can be under increased stress due to the deflection being 1.4 mm, which results in a force of about 144 N. In an example of the latter case, latch mechanism 116 can be under decreased stress due to the deflection being 0.2 mm, which results in a force of about 53 N. In either situation, latch mechanism 116 provides sufficient force to maintain contact between input connector 108 and output connector 114 without overly stressing CSCB 100 or PCI cassette 102 (all shown in FIG. 1A).

Similarly, in the illustrated embodiment, the force from latch mechanism 216 is nominally about 82 N. This can occur when all the components are nominally sized and positioned, which results in a nominal deflection of 0.8 mm. However, there can be deviations from the nominal configuration, for example, due to tolerance stacking. This can cause, for example, pawl 232 to engage lug 106 (both shown in FIG. 5A) sooner or later. In an example of the former case, latch mechanism 216 can be under increased stress due to the deflection being 1.4 mm, which results in a force of about 122 N. In an example of the latter case, latch mechanism 116 can be under decreased stress due to the deflection being 0.2 mm, which results in a force of about 30 N. In either situation, latch mechanism 216 provides sufficient force to maintain contact between input connector 108 and output connector 114 without overly stressing CSCB 100 or PCI cassette 102 (all shown in FIG. 1A).

Both force versus deflection curves 144 and 146 start with an initial preloaded state, and gradually increase in load as the deflection increases. These attributes can be attributed to the dual spring design of latch mechanisms 116 and 216. This is in contrast to a conventional single spring design (not shown) which can exhibit behavior depicted by force versus deflection curve 148. The conventional single spring design has disadvantages due to its zero initial load and a steep rise in force as deflection increases. This results in unacceptably low and high amounts of force at the same deviations from the nominal deflection as latch mechanisms 116 and 216 and/or a much smaller range allowable deviation from the nominal deflection at the same minimum and maximum forces as latch mechanisms 116 and 216. For an example of the latter, latch mechanism 116 goes from about 53 N to about 144 N over 1.2 mm (i.e., 0.20 mm to 1.4 mm), whereas the conventional single spring design goes from about 53 N to about 144 N over only about 0.29 mm (i.e., about 0.27 mm to about 0.56 mm). For example, latch mechanism 216 goes from about 30 N to about 122 N over about 1.2 mm (i.e., 0.20 mm to 1.4 mm), whereas the conventional single spring design goes from about 96 N to about 144 N over only about 0.30 mm (i.e., about 0.20 mm to about 0.50 mm). Thereby, the conventional single spring design is much less accommodating of looser tolerances than latch mechanisms 116 and 216 are.

Figure 5B:
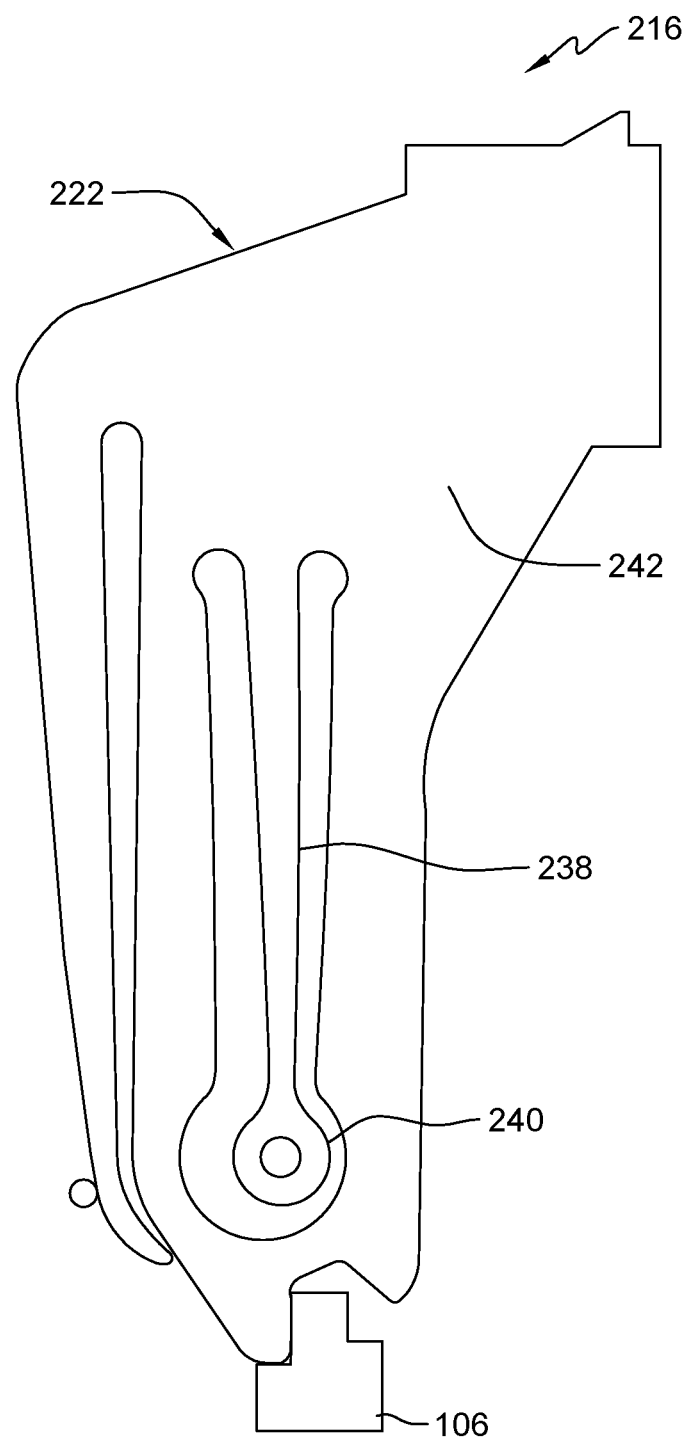
FIG. 5B is a side view of the alternative latch mechanism of the PCI cassette in the closed configuration showing elastic deformation of a primary spring and a secondary spring, in accordance with an embodiment of the present disclosure.

FIG. 5A is a side view of alternative latch mechanism 216 of the PCI cassette 202 in a closed configuration. FIG. 5B is a side view of alternative latch mechanism 216 of the PCI cassette in the closed configuration showing elastic deformation (exaggerated for clarity) of primary spring 218 and secondary spring 238. In the illustrated embodiment, latch mechanism 216 is similar to latch mechanism 116 (shown in FIG. 2A) except that primary spring 218 is integral to latch 222. Thereby, the same reference numerals will be used for latch mechanism 216 where the corresponding components are the same as in latch mechanism 116. However, reference numerals that are one hundred higher are used for components of latch mechanism 216 that are different from those in latch mechanism 116. FIGS. 5A and 5B will now be discussed in conjunction with one another.

In the illustrated embodiment, housing 210 serves as a mounting bracket for the components of latch mechanism 216. Latch mechanism 216 includes stop 220, latch 222, and brace 224 (shown in phantom for clarity). Primary spring 218 is rigidly connected to latch 222 at the top end and is cantilevered downward therefrom. Primary spring 218 is prevented from moving (leftward) to a neutral state by stop 220, which is a pin extending from housing 210. Thereby, primary spring 218 is biased towards stop 220, and when latch 222 is initially moved from the opened position towards the closed position, primary spring 218 exerts a preloaded amount of force urging against this motion of latch 222. As latch 222 is closed further, primary spring 218 is forced closer toward the rest of latch 222 and offers greater connecting force to PCI cassette 202.

The purpose of latch mechanism 216 moving to the closed configuration is to insert PCI cassette 202 into CSCB 100

(shown in FIG. 1A). This is accomplished by a user (not shown) pressing on finger pad 228. Because latch 222 is rotatably connected to housing 210 by pin 230, latch 222 rotates about pin 230 which causes pawl 232 to engage lug 106. Latch 222 can be captured by lock 234, which maintains latch mechanism 216 in the closed configuration. Similarly, latching mechanism 216 can move to the opened configuration to extract PCI cassette 202 from CSCB 100. This is accomplished by a user disengaging lock 234 and rotating finger pad 228 away from housing 210. This causes latch 222 to rotate about pin 230 which causes pawl 236 to engage the opposite side of lug 106.

Latch 222 itself includes secondary spring 238 between mounting portion 240 and the main body 242 of latch 222. When latch mechanism 216 is in the closed configuration, secondary spring 238 also elastically deforms. Thereby, both primary spring 218 and secondary spring 238 exert force on PCI cassette 102 towards CSCB 100, which ensures that the connection between input connector 108 and output connector 114 (both shown in FIG. 1A) is maintained. In addition, any twisting movement of latch 222 under load is prevented by being sandwiched between housing 210 and brace 224.

Figure 6:
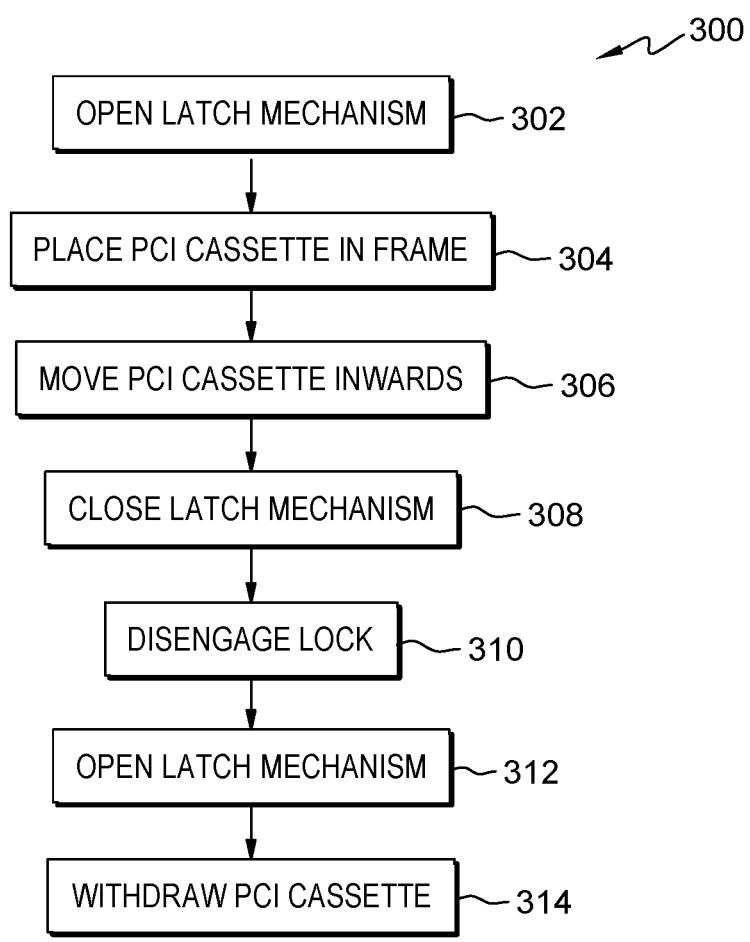
FIG. 6 is a flowchart of a method of loading and unloading the PCI cassette from the CSCB, in accordance with an embodiment of the present disclosure.

FIG. 6 is a flowchart of method 300 of loading and unloading a PCI cassette 102/202 from a CSCB 100. During the discussion of FIG. 6, references may be made to features of latch mechanism 116 and/or 216 shown in FIGS. 1A-5B, respectively.

In the illustrated embodiment, at operation 302, latch mechanism 116/216 is moved to the opened configuration to begin loading PCI cassette 102/202. At operation 304, PCI cassette 102/202 is placed in docking position in frame 104 of CSCB 100. At operation 306, PCI cassette 102/202 is moved inwards so that output connector 114 connects to the respective input connector 108 and so that pawl 132/232 is moved beyond the respective lug 106. At operation 308, finger pad 128/228 is pressed to fully seat PCI cassette 102/202 into CSCB 100 by pawl 132/232 contacting the inner side of lug 106. In addition, at operation 308, primary spring 118/218 and secondary spring 138/238 are compressed, and lock 134/234 catches nub 135 to ensure that latch mechanism 116/216 remains in the closed configuration.

At operation 310, to begin unloading PCI cassette 102/202, lock 134/234 is disengaged. At operation 312, latch mechanism 116/216 is opened by pulling finger pad 128/228 away from CSCB 100. This causes pawl 136/236 to contact the outer side of lug 106 and moves PCI cassette 102/202 outward with respect to CSCB 100. At operation 314, PCI cassette 102/202 is withdrawn from CSCB 100, disconnecting output connector 114 from input connector 108.

Further Discussion of Some Exemplary Embodiments

The following are non-exclusive descriptions of some exemplary embodiments of the present disclosure.

A latch mechanism, according to an exemplary embodiment of this disclosure, among other possible things, includes: a mounting bracket; a stop connected to the mounting bracket; a first spring connected to the mounting bracket and in contact with the stop to preload the first spring; and a latch comprising: a second spring rotatably connected to the mounting bracket; and a body connected to the second spring, the body comprising: a pad at one end of the body; and a first pawl at a second end of the body opposite of the pad.

The latch mechanism of the preceding paragraph can optionally include, additionally and/or alternatively, any one or more of the following features, configurations, and/or additional components:

A further embodiment of the foregoing latch mechanism, wherein: the latch comprises a mounting portion at one end of the second spring; and the second spring is connected to the body at an opposite end from the mounting portion.

A further embodiment of any of the foregoing latch mechanisms, wherein the mounting portion is positioned between the pad and the first pawl.

A further embodiment of any of the foregoing latch mechanisms, further comprising a second pawl at the second end of the body.

A further embodiment of any of the foregoing latch mechanisms, wherein the first spring and the latch are flat steel components.

A further embodiment of any of the foregoing latch mechanisms, further comprising a brace connected to the mounting bracket and extending over the latch to prevent twisting of the latch.

A computer system component bay, according to an exemplary embodiment of this disclosure, among other possible things, includes: a frame comprising: a lug; and an input connector; and a cassette configured to be inserted into the frame, the cassette comprising: a housing; an output connector connected to the electronic component and configured to connect with the input connector; and a latch mechanism comprising: a first spring connected to the housing; and a latch configured to engage the first spring and the lug when the latch mechanism is in the closed configuration, wherein the latch comprises a second spring rotatably connected to the housing.

The computer system component bay of the preceding paragraph can optionally include, additionally and/or alternatively, any one or more of the following features, configurations, and/or additional components:

A further embodiment of the foregoing computer system component bay, wherein the cassette further comprises an electronic component connected to the housing.

A further embodiment of any of the foregoing computer system component bays, wherein: the latch mechanism further comprises a stop connected to the housing; and the first spring is in contact with the stop to preload the first spring when the latch mechanism is in an opened position.

A further embodiment of any of the foregoing computer system component bays, wherein the latch further comprises a first pawl configured to engage the lug when the latch mechanism is in the closed configuration.

A further embodiment of any of the foregoing computer system component bays, wherein the latch further comprises a second pawl to engage the lug when the latch mechanism is moved from the closed configuration to an opened configuration.

A further embodiment of any of the foregoing computer system component bays, wherein the first spring and the latch are flat steel components.

A latch mechanism, according to an exemplary embodiment of this disclosure, among other possible things, includes: a mounting bracket; a stop connected to the mounting bracket; and a latch rotatably connected to the mounting bracket, the latch comprising: a body comprising: a pad at a first end of the body; and a pawl at a second end of the body opposite of the pad; a first spring connected to the body and in contact with the stop to preload the first spring; and a second spring connected to the body.

The latch mechanism of the preceding paragraph can optionally include, additionally and/or alternatively, any one or more of the following features, configurations, and/or additional components:

A further embodiment of the foregoing latch mechanism, wherein: the latch comprises a mounting portion at one end of the second spring; and the second spring is connected to the body at an opposite end from the mounting portion.

A further embodiment of any of the foregoing latch mechanisms, wherein the mounting portion is positioned between the pad and the first pawl.

A further embodiment of any of the foregoing latch mechanisms, further comprising a second pawl at the second end of the body.

A further embodiment of any of the foregoing latch mechanisms, wherein the first spring and the latch are flat steel components.

A further embodiment of any of the foregoing latch mechanisms, further comprising a brace connected to the mounting bracket and extending over the latch to prevent twisting of the latch.

A computer system component bay, according to an exemplary embodiment of this disclosure, among other possible things, includes: a frame comprising: a lug; and an input connector; and a cassette configured to be inserted into the frame, the cassette comprising: a housing; an output connector connected to the electronic component and configured to connect with the input connector; and a latch mechanism comprising: a stop connected to the housing; and a latch comprising: a body; a first spring connected to the body; and a second spring connected to the body, wherein the second spring is rotatably connected to the housing at a location opposite to the body.

The computer system component bay of the preceding paragraph can optionally include, additionally and/or alternatively, any one or more of the following features, configurations, and/or additional components:

A further embodiment of the foregoing computer system component bay, wherein the cassette further comprises an electronic component connected to the housing.

A further embodiment of any of the foregoing computer system component bays, wherein: the first spring is in contact with the stop to preload the first spring when the latch mechanism is in an opened position.

A further embodiment of any of the foregoing computer system component bays, wherein the latch further comprises a first pawl connected to the body, wherein the first pawl is configured to engage the lug when the latch mechanism is in the closed configuration.

A further embodiment of any of the foregoing computer system component bays, wherein the latch further comprises a second pawl to engage the lug when the latch mechanism is moved from the closed configuration to an opened configuration.

A further embodiment of any of the foregoing computer system component bays, wherein the first spring and the latch are flat steel components.

A method of operating a computer system component bay, according to an exemplary embodiment of this disclosure, among other possible things, includes: placing a cassette into a frame; engaging an output connector of the cassette with an input connector of the frame; engaging a lug on the frame with a latch of a latching mechanism of the cassette; rotating the latch to force the cassette farther into the frame and to engage a first spring of the cassette with the latch; and rotating the latch further to elastically deform the first spring and a second spring of the latch to move the latching mechanism into a closed configuration.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A latch mechanism comprising:
    a mounting bracket;
    a stop connected to the mounting bracket that is stationary relative to the mounting bracket;
    a first spring rigidly connected to the mounting bracket at a first end of the first spring, the first spring in contact with the stop at a second end of the first spring that is opposite of the first end to preload the first spring; and
    a latch comprising:
        a second spring rotatably connected to the mounting bracket; and
        a body connected to the second spring, the body comprising:
    a pad at one end of the body; and
    a first pawl at a second end of the body opposite of the pad.

2. The latch mechanism of claim 1, wherein:
    the latch comprises a mounting portion at one end of the second spring; and
    the second spring is connected to the body at an opposite end from the mounting portion.

3. The latch mechanism of claim 2, wherein the mounting portion is positioned between the pad and the first pawl.

4. The latch mechanism of claim 1, further comprising a second pawl at the second end of the body.

5. The latch mechanism of claim 1, wherein the first spring and the latch are flat steel components.

6. The latch mechanism of claim 1, further comprising a brace connected to the mounting bracket and extending over the latch to prevent twisting of the latch.

7. A computer system component bay comprising:
    a frame comprising:
        a lug; and
        an input connector; and
    a cassette configured to be inserted into the frame, the cassette comprising:
        a housing;
        an output connector configured to connect with the input connector; and
        a latch mechanism comprising:
            a stop connected to the housing that is stationary relative to the housing;
            a first spring rigidly connected to the housing at a first end of the first spring, the first spring in contact with the stop at a second end of the first spring that is opposite of the first end to preload the first spring; and
            a latch configured to engage the first spring and the lug when the latch mechanism is in a closed configuration, wherein the latch comprises a second spring rotatably connected to the housing and a body connected to the second spring, the body comprising a pad at one end of the body and a first pawl at a second end of the body opposite of the pad.

8. The computer system component bay of claim 7, wherein the cassette further comprises an electronic component connected to the housing.

9. The computer system component bay of claim 7, wherein
the first spring is in contact with the stop to preload the first spring when the latch mechanism is in an opened configuration.

10. The computer system component bay of claim 7, wherein the latch further comprises a second pawl to engage the lug when the latch mechanism is moved from the closed configuration to an opened configuration.

11. The computer system component bay of claim 7, wherein the first spring and the latch are flat steel components.

12. A method of operating a computer system component bay comprises:
placing a cassette into a frame;
engaging an output connector of the cassette with an input connector of the frame;
engaging a lug on the frame with a latch of a latching mechanism of the cassette, wherein the latching mechanism comprises:
a mounting bracket;
a stop connected to the mounting bracket that is stationary relative to the mounting bracket;
a first spring rigidly connected to the mounting bracket at a first end of the first spring, the first spring in contact with the stop at a second end of the first spring that is opposite of the first end to preload the first spring; and
a latch comprising a second spring rotatably connected to the mounting bracket and a body connected to the second spring, wherein the body comprises a pad at one end of the body and a first pawl at a second end of the body opposite of the pad;

rotating the latch to force the cassette farther into the frame and to engage the first spring with the latch; and
rotating the latch further to elastically deform the first spring and the second spring of the latch to move the latching mechanism into a closed configuration.

13. A latch mechanism comprising:
a mounting bracket;
a stop connected to the mounting bracket;
a first spring rigidly connected to the mounting bracket at a first end of the first spring, the first spring in contact with the stop at a second end of the first spring to preload the first spring; and
a latch comprising:
a second spring rotatably connected to the mounting bracket through a pin;
a body connected to the second spring, the body comprising:
a finger pad at a first end of the body; and
a first pawl at a second end of the body opposite of the finger pad;
a mounting portion at a second end of the second spring, wherein the second spring is integrally connected to the body at an opposite first end of the second spring from the mounting portion; and
a brace extended from the mounting bracket and extending over the latch, wherein the second end of the second spring is sandwiched between the brace and the mounting bracket;
wherein, when a user presses the finger pad toward the mounting bracket, the latch elastically deforms the first spring and the second spring to move the mounting bracket into a closed configuration with a frame.

14. The latch mechanism of claim 1, wherein the latch mechanism comprises an open configuration and a closed configuration and wherein when the latch mechanism is in the closed configuration, the first spring is not in contact with the stop.

* * * * *